(12) United States Patent
Baratam, Jr. et al.

(10) Patent No.: US 11,900,039 B2
(45) Date of Patent: Feb. 13, 2024

(54) MULTI-INPUT LOGIC CIRCUITRY

(71) Applicant: Arm Limited, Cambridge (GB)

(72) Inventors: Anil Kumar Baratam, Jr., Bangalore (IN); Subramanya Ravindra Shindagikar, Bangalore (IN)

(73) Assignee: Arm Limited, Cambridge (GB)

( * ) Notice: Subject to any disclaimer, the term of this patent is extended or adjusted under 35 U.S.C. 154(b) by 168 days.

(21) Appl. No.: 17/175,639

(22) Filed: Feb. 13, 2021

(65) Prior Publication Data

US 2021/0165945 A1    Jun. 3, 2021

Related U.S. Application Data

(63) Continuation of application No. 16/144,688, filed on Sep. 27, 2018, now Pat. No. 10,922,465.

(51) Int. Cl.
*G06F 30/39* (2020.01)
*G11C 7/10* (2006.01)
*H03K 19/21* (2006.01)
*G11C 11/40* (2006.01)

(52) U.S. Cl.
CPC .......... *G06F 30/39* (2020.01); *G11C 7/10* (2013.01); *G11C 11/40* (2013.01); *H03K 19/21* (2013.01)

(58) Field of Classification Search
CPC ...... G06F 30/39; G06F 9/3869; G06F 9/3875; H03K 19/21; G11C 7/10; G11C 11/40
See application file for complete search history.

(56) References Cited

U.S. PATENT DOCUMENTS

| 4,631,424 | A | * | 12/1986 | Miyagi | H03K 19/09445 |
| | | | | | 326/120 |
| 5,030,852 | A | * | 7/1991 | Higashisaka | H03K 19/0952 |
| | | | | | 326/116 |
| 5,237,220 | A | * | 8/1993 | Kurashima | H03K 19/0866 |
| | | | | | 326/126 |
| 5,412,614 | A | * | 5/1995 | Bird | G11C 17/10 |
| | | | | | 365/163 |
| 5,923,188 | A | * | 7/1999 | Kametani | G06F 1/10 |
| | | | | | 327/295 |
| 6,122,751 | A | * | 9/2000 | Janssens | G06F 9/3875 |
| | | | | | 712/E9.063 |

(Continued)

FOREIGN PATENT DOCUMENTS

| JP | 2013073663 A | * | 4/2013 | ............... | G11C 8/08 |
| KR | 2010060098 A | * | 6/2010 | | |

(Continued)

*Primary Examiner* — Nha T Nguyen
(74) *Attorney, Agent, or Firm* — Pramudji Law Group PLLC; Ari Pramudji

(57) ABSTRACT

Various implementations described herein refer to an integrated circuit having multiple stages including a first stage, a second stage, and a third stage. The first stage has first logic structures coupled in series, and the first logic structures are activated with multiple signals. The second stage has second logic structures coupled in parallel, and the second logic structures are activated with the multiple signals. The third stage has a first input, a second input, and an output. The first input is coupled to the first stage, the second input is coupled to the second stage, and the output provides an output signal based on the multiple signals.

16 Claims, 13 Drawing Sheets

(56) References Cited

U.S. PATENT DOCUMENTS

| | | | | |
|---|---|---|---|---|
| 6,954,401 B2 * | 10/2005 | Kanetani | | G11C 8/10 |
| | | | | 365/233.5 |
| 6,975,134 B2 * | 12/2005 | Kuang | | H03K 19/0016 |
| | | | | 326/86 |
| 7,068,554 B1 * | 6/2006 | Dawson | | G11C 29/842 |
| | | | | 365/194 |
| 7,395,307 B2 * | 7/2008 | Ikeno | | G06F 7/508 |
| | | | | 708/710 |
| 8,006,147 B2 * | 8/2011 | Bull | | G01R 31/3177 |
| | | | | 714/721 |
| 8,773,185 B2 * | 7/2014 | Subramanian | | H03L 7/0812 |
| | | | | 327/158 |
| 9,984,187 B1 * | 5/2018 | Sultania | | G06F 30/33 |
| 10,133,839 B1 * | 11/2018 | Vanukuri | | G06F 30/30 |
| 10,187,063 B1 * | 1/2019 | Scantlin | | H03K 3/012 |
| 10,303,624 B2 * | 5/2019 | Tune | | G06F 13/14 |
| 10,355,674 B2 * | 7/2019 | Baratam | | H03K 3/012 |
| 10,592,439 B2 * | 3/2020 | Tune | | G06F 13/14 |
| 10,715,148 B1 * | 7/2020 | Herberholz | | H03K 19/1733 |
| 10,734,805 B2 * | 8/2020 | Sandhu | | H01L 27/0288 |
| 11,087,834 B2 * | 8/2021 | Chong | | G11C 11/418 |
| 11,398,813 B2 * | 7/2022 | Fan | | H02M 3/07 |
| 11,405,040 B2 * | 8/2022 | Baratam | | H03K 19/17744 |
| 2003/0184454 A1 * | 10/2003 | Okamura | | H03M 7/14 |
| | | | | 341/58 |
| 2006/0059222 A1 * | 3/2006 | Dewan | | G06F 7/501 |
| | | | | 708/700 |
| 2008/0169487 A1 * | 7/2008 | Shimbo | | H01L 27/0207 |
| | | | | 257/E27.07 |
| 2018/0129475 A1 * | 5/2018 | Almagambetov | | G06F 7/525 |
| 2019/0311156 A1 * | 10/2019 | Tehranipoor | | G06F 30/394 |

FOREIGN PATENT DOCUMENTS

| | | | | |
|---|---|---|---|---|
| KR | 2018149340 A | * | 11/2018 | |
| TW | 200816644 A | * | 4/2008 | H03D 13/004 |

* cited by examiner

MULTI-INPUT LOGIC CIRCUITRY

RELATED APPLICATIONS

This application is a continuation of U.S. patent application Ser. No. 16/144,688, filed 2018 Sep. 27, titled MULTI-INPUT LOGIC CIRCUITRY, and the entire disclosure of which is incorporated herein by reference in its entirety.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Some conventional logic gates consume significant area on a chip, and some conventional logic gates are slow in performance. As such, there exists a need to improve area consumption, speed and performance of some logic gate designs.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to multi-input logic circuitry with improved area and performance. For instance, various schemes and techniques described herein are directed to improved circuit designs for multi-input XOR (exclusive OR) and/or XNOR (Exclusive NOR) type logic gates along with full adder applications. These improved circuit designs may be implemented in 2-input and 3-input XOR and XNOR logic gates, and similar concepts may be extended to any number (n) of bits, such as, e.g., n-bit XOR/XNOR logic gates. The schemes and techniques described herein provide for smaller XOR2, XNOR2, XOR3, XNOR3 circuits (smaller in area, e.g., by 1-4 poly pitches), which are cells used in some core implementations and may be used to save area. The area and performance optimized variants of these cells may also be used in any related designs, and the schemes, techniques and various circuitry described herein provide for area optimized variants of such cells.

Various implementations of multi-input logic circuitry will now be described in greater detail herein with reference to FIGS. 1A-7.

Figure 1A:
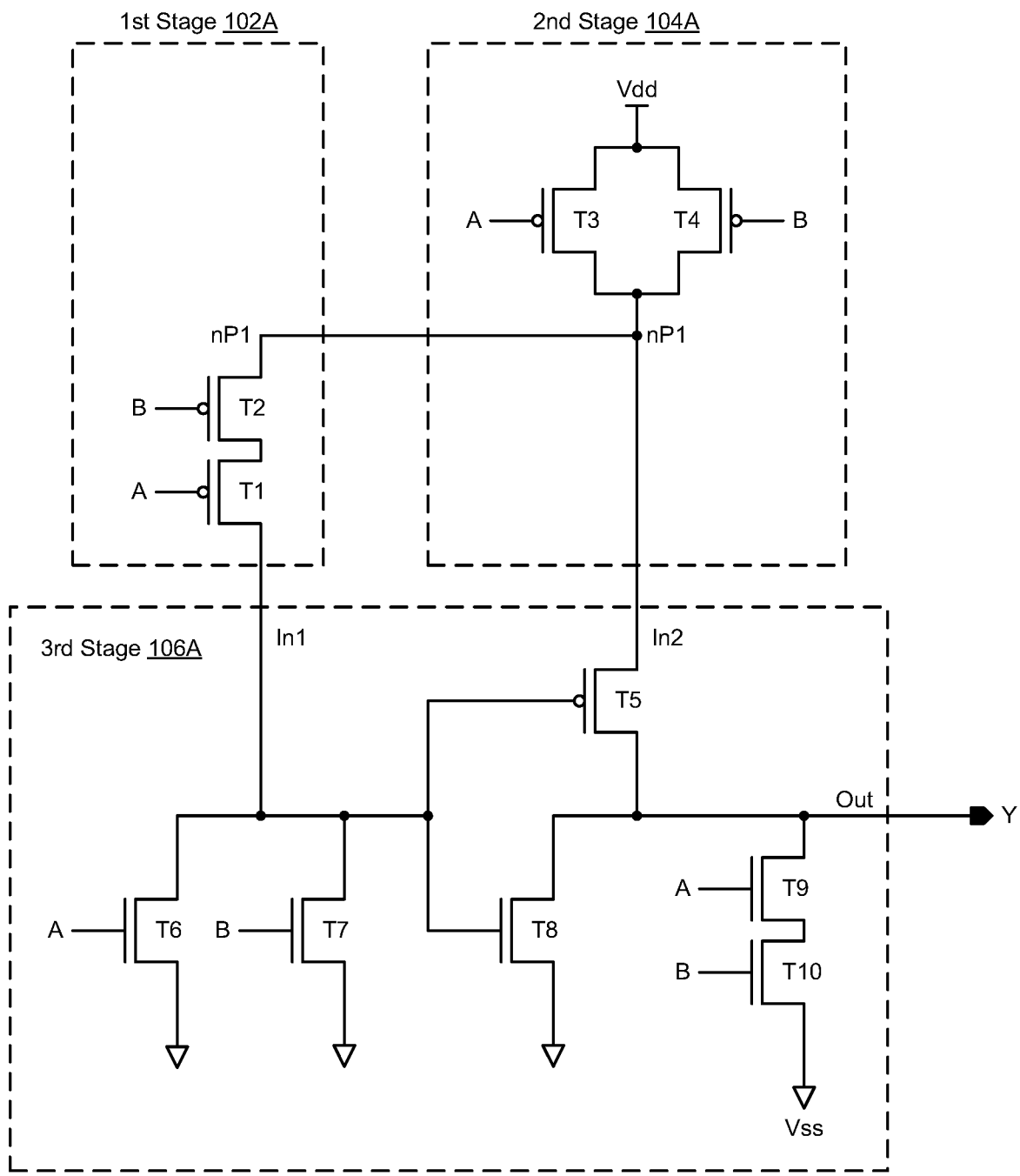
FIGS. 1A-1B illustrate diagrams of multi-input logic circuitry in accordance with various implementations described herein.
Figure 1B:
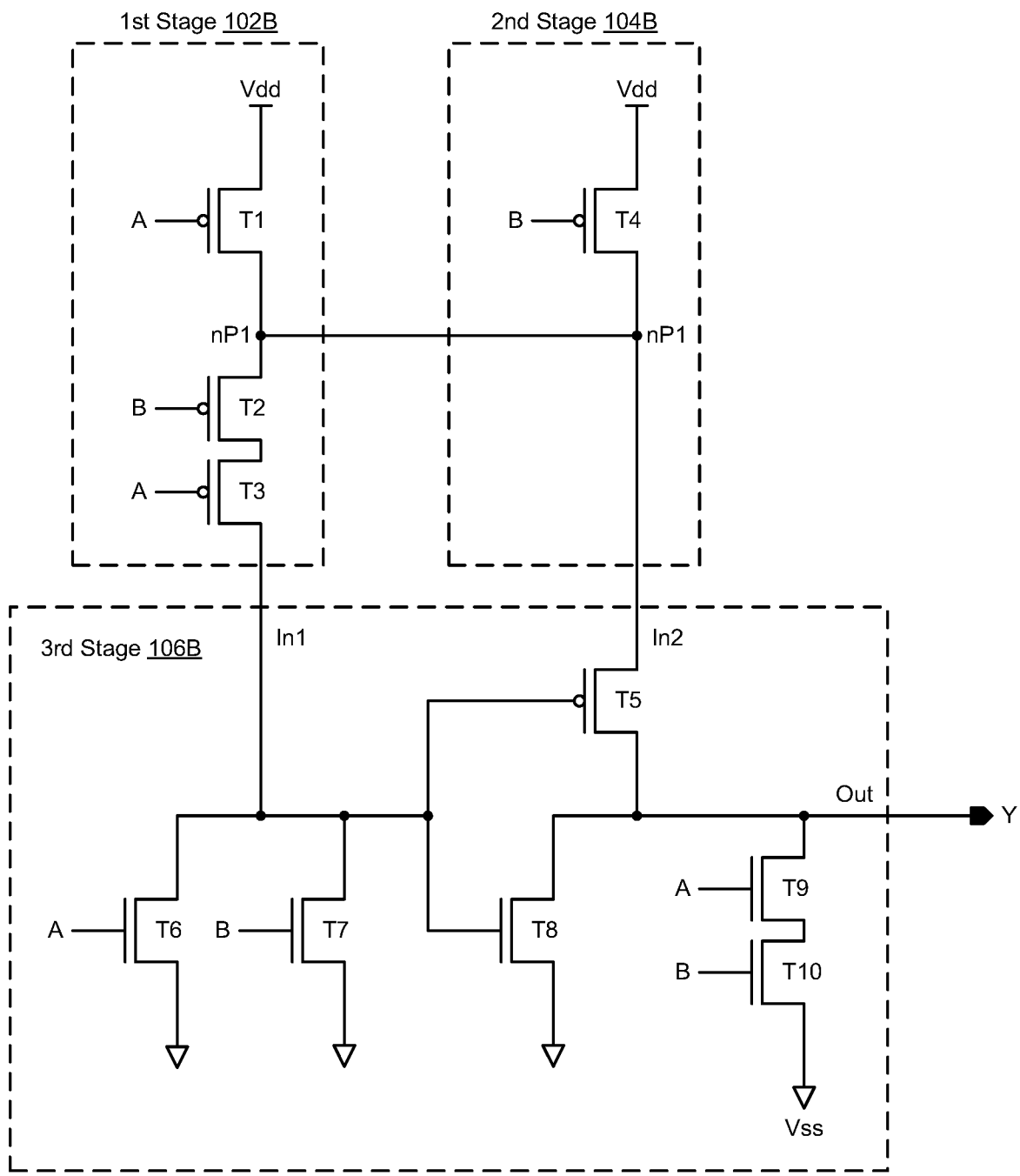

FIGS. 1A-1B illustrate diagrams of multi-input logic circuitry in accordance with various implementations described herein. In particular, FIG. 1A illustrates a circuit diagram of multi-input logic circuitry 100A, and FIG. 1B illustrates a circuit diagram of multi-input logic circuitry 100B.

As shown in FIG. 1A, the multi-input logic circuitry 100A may include multiple stages of circuitry including a first stage 102A, a second stage 104A and a third stage 106A that are coupled together and arranged to receive multiple input signals (A, B) and provide an output (Y) based on the multiple input signals (A, B). In some implementations, the multi-input logic circuitry 100A may operate as a multi-input logic gate, such as, e.g., a 2-input XOR gate (i.e., XOR2) having 2-inputs (A, B) and 1-output (Y).

The first stage 102A may include first logic structures T1, T2 that are coupled in series, and the first logic structures T1, T2 may be activated with multiple signals, such as, e.g., the multiple input signals (A, B). The first logic structures T1, T2 of the first stage 102A may include a first logic structure T1 and a second logic structure T2 that are coupled in series. The first logic structure T1 may be activated with a first signal (A) of the multiple signals (A, B), and the second logic structure T2 may be activated with a second signal (B) of the multiple signals (A, B). In some instances, the first logic structure T1 may be implemented with a first transistor (e.g., PMOS transistor), and the second logic structure T2 may be implemented with a second transistor (e.g., PMOS transistor). Also, as shown, the first transistor T1 may be coupled to the second transistor T2 in series between a first input (In1) and a second input (In2) of the third stage 106A via node nP1.

The second stage 104A may include second logic structures T3, T4 that are coupled in parallel, and the second logic structures T3, T4 may be activated with the multiple signals, such as, e.g., multiple input signals (A, B). The second logic structures T3, T4 of the second stage 104A may include a third logic structure T3 and a fourth logic structure T4 that are coupled in parallel. The third logic structure T3 may be activated with the first signal (A), and the fourth logic structure T4 may be activated with the second signal (B). In some implementations, the third logic structure T3 may be implemented with a third transistor (e.g., PMOS transistor), and the fourth logic structure T4 may be implemented with a fourth transistor (e.g., PMOS transistor). Also, the third transistor T3 may be coupled to the fourth transistor T4 in parallel between a voltage supply (Vdd) and the second input (In2) of the third stage 106A via node nP1.

The third stage 106A may have a first input (In1), a second input (In2), and an output (Out) such that the first input (In1) may be coupled to the first stage 102A, the second input (In2) may be coupled to the second stage 104A, and the output (Out) may provide the output signal (Y) based on the multiple signals, such as, e.g., the multiple input signals (A, B). The third stage 106A may include multiple third logic structures T5 (PMOS), T6 (NMOS), T7 (NMOS), T8 (NMOS), T9 (NMOS), T10 (NMOS) that are coupled to the first input (In1), the second input (In2), and the output (Out). As shown, at least one third logic structure (e.g., T6, T9) of the multiple third logic structures may be activated with the first input signal (A), and at least one other third logic structure (e.g., T7, T10) of the multiple third logic structures may be activated with the second input signal (B).

In some implementations, the third logic structures T5 (PMOS), T6 (NMOS), T7 (NMOS), T8 (NMOS), T9 (NMOS), T10 (NMOS) may be implemented with transistors, such as, e.g., PMOS transistors or NMOS transistors. As shown in reference to the third stage 106A, transistors T6, T7 may be coupled in parallel between the first input (In1) and ground (Vss). Also, gates of transistors T5, T8 may be coupled to the first input (In1) and activated with a signal therefrom, and transistors T5, T8 may be coupled in series between the second input and ground (Vss). In addition, the output signal (Y) may be taken from the output (Out) that is coupled between transistors T5, T8. Also, transistors T9, T10 may be coupled in series between the output (Out) and ground (Vss).

In some instances, the multi-input logic circuitry 100A may be implemented as an integrated circuit that operates as an XOR gate such that the output (Out) from the third stage 106A provides the output signal (Y) as an XOR logic output signal. In this instance, the first input signal (A) may refer to a first XOR input signal, and the second input signal (B) may refer to a second XOR input signal. As such, the output signal (Y) may refer to an XOR logic output signal (Y) that may be based on the first XOR input signal (A) and the second XOR input signal (B). This topology of FIG. 1A provides for a low area high performance solution for an XOR2 cell. In other instances, the multi-input logic circuitry 100A may be reconfigured as an integrated circuit that operates as an XNOR gate, which is described herein below in reference to FIG. 5A.

As shown in FIG. 1B, the multi-input logic circuitry 100B may include multiple stages of circuitry including a first stage 102B, a second stage 104B and a third stage 106B that are coupled together and arranged to receive multiple input signals (A, B) and provide an output (Y) based on the multiple input signals (A, B). In some implementations, the multi-input logic circuitry 100B may operate as a multi-input logic gate, such as, e.g., a 2-input XOR gate (i.e., XOR2) having 2-inputs (A, B) and 1-output (Y). The multi-input logic circuitry 100B refers to an alternate reconfiguration of the multi-input logic circuitry 100A of FIG. 1A, and as such, similar components may have similar features, scope, and operational characteristics.

The first stage 102B includes multiple first logic structures T1, T2, T3, wherein at least one first logic structure T1, T3 of the multiple first logic structures may be activated with the first input signal (A), and wherein at least one other first logic structure (T3) of the multiple first logic structures is activated with a second input signal (B) that is different than the first input signal (A). As shown, the multiple first logic structures T1, T2, T3 may be implemented with multiple first transistors that are arranged in a series stack between the voltage supply (Vdd) and the first input (In1) of the third stage 106B. The at least one first logic structure T1 of the multiple first logic structures may be implemented with a first transistor (e.g., PMOS transistor) that is coupled in parallel with the at least one second logic structure (T4) of the second stage 104B. In this instance, the first transistor T1 may be coupled between the voltage supply (Vdd) and the second input (In2) of the third stage 106B via the node nP1. The multiple first logic structures may include a second transistor T2 (e.g., PMOS transistor) and a third transistor T3 (e.g., PMOS transistor) that are coupled in series between the first transistor T1 and the first input (In1) of the third stage 106B. The node nP1 is disposed between the first transistor T1 and the second transistor T2, and the third transistor T3 is disposed between the second transistor T2 and the first input (In1) of the third stage 106B.

The second stage 104B includes at least one second logic structure T4 that is coupled in parallel with the at least one first logic structure T1 of the first stage 102B, wherein the at least one second logic structure T4 of the second stage 104B is activated with the second input signal (B). The at least one second logic structure T4 may be implemented with a transistor (e.g., PMOS transistor) that is coupled between the voltage supply (Vdd) and the second input (In2) of the third stage 106B via the node nP1.

The third stage 106B is similar to the third stage 106A of FIG. 1A such that the third stage 106B includes the first input (In1), the second input (In2) that is separate from the first input (In1), and the output (Out). Also, as shown, the first input (In1) may be coupled to the first stage 102B, the second input (In2) may be coupled to the second stage 104B, and the output (Out) may provide a third signal (Y) that is based on the first input signal (A) and the second input signal (B). The third stage 106B includes the multiple third logic structures T5 (PMOS), T6 (NMOS), T7 (NMOS), T8 (NMOS), T9 (NMOS), T10 (NMOS), which are coupled to the first input (In1), the second input (In2), and the output (Out), as described herein above in reference to the third stage 104A of FIG. 1A.

In some instances, the multi-input logic circuitry 100B may be implemented as an integrated circuit that operates as an XOR gate such that the output (Out) from the third stage 106B provides the output signal (Y) as an XOR logic output signal. In this instance, the first input signal (A) may refer to a first XOR input signal, and the second input signal (B) may refer to a second XOR input signal. As such, the output signal (Y) may refer to an XOR logic output signal (Y) that may be based on the first XOR input signal (A) and the second XOR input signal (B). This topology of FIG. 1B provides for a low area high performance solution for an XOR2 cell. In other instances, the multi-input logic circuitry 100B may be reconfigured as an integrated circuit that operates as an XNOR gate, which is described herein below in reference to FIG. 5B.

Figure 2A:
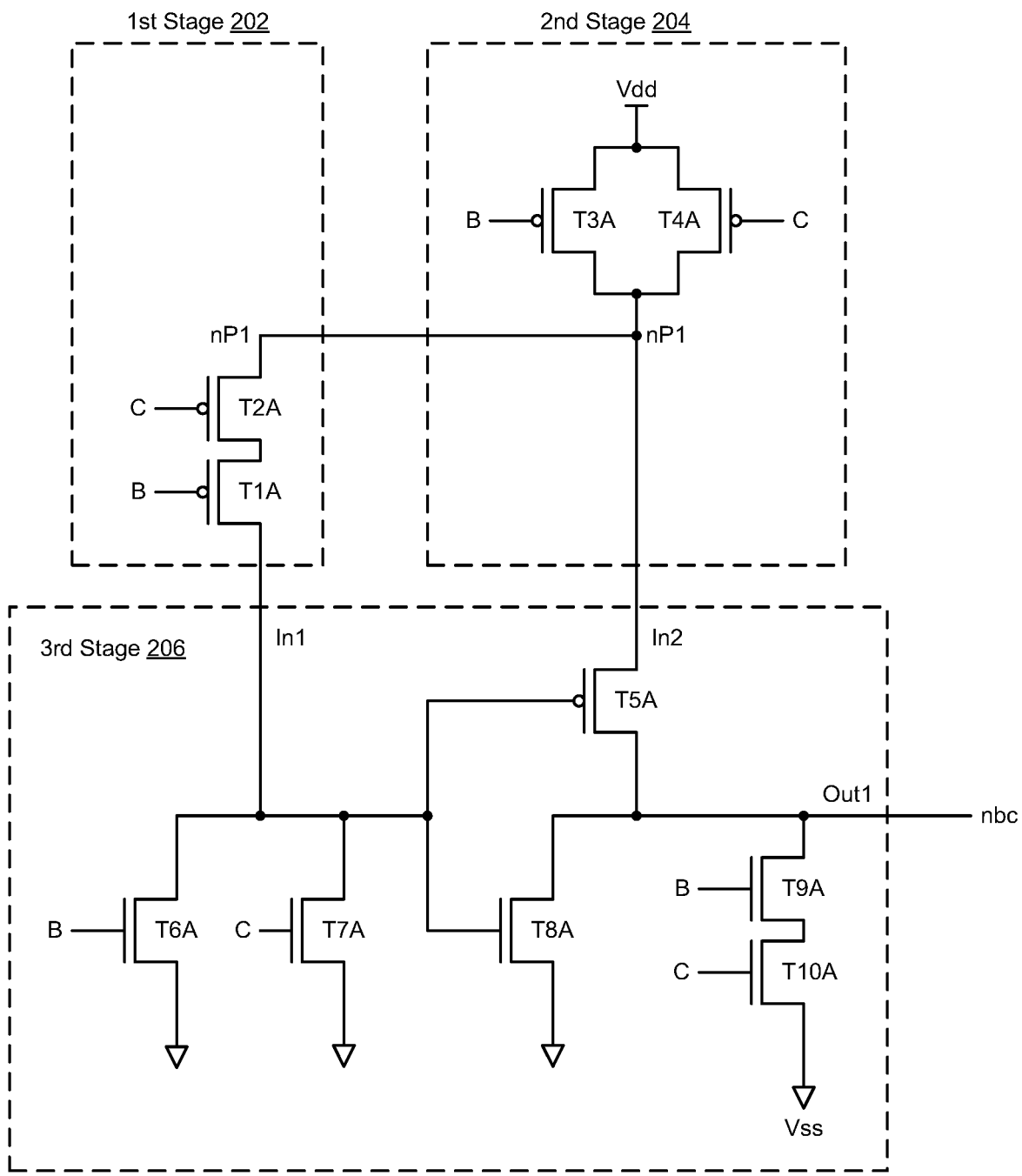
FIGS. 2A-2B and 3 illustrate diagrams of other multi-input logic circuitry in accordance with various implementations described herein.
Figure 2B:
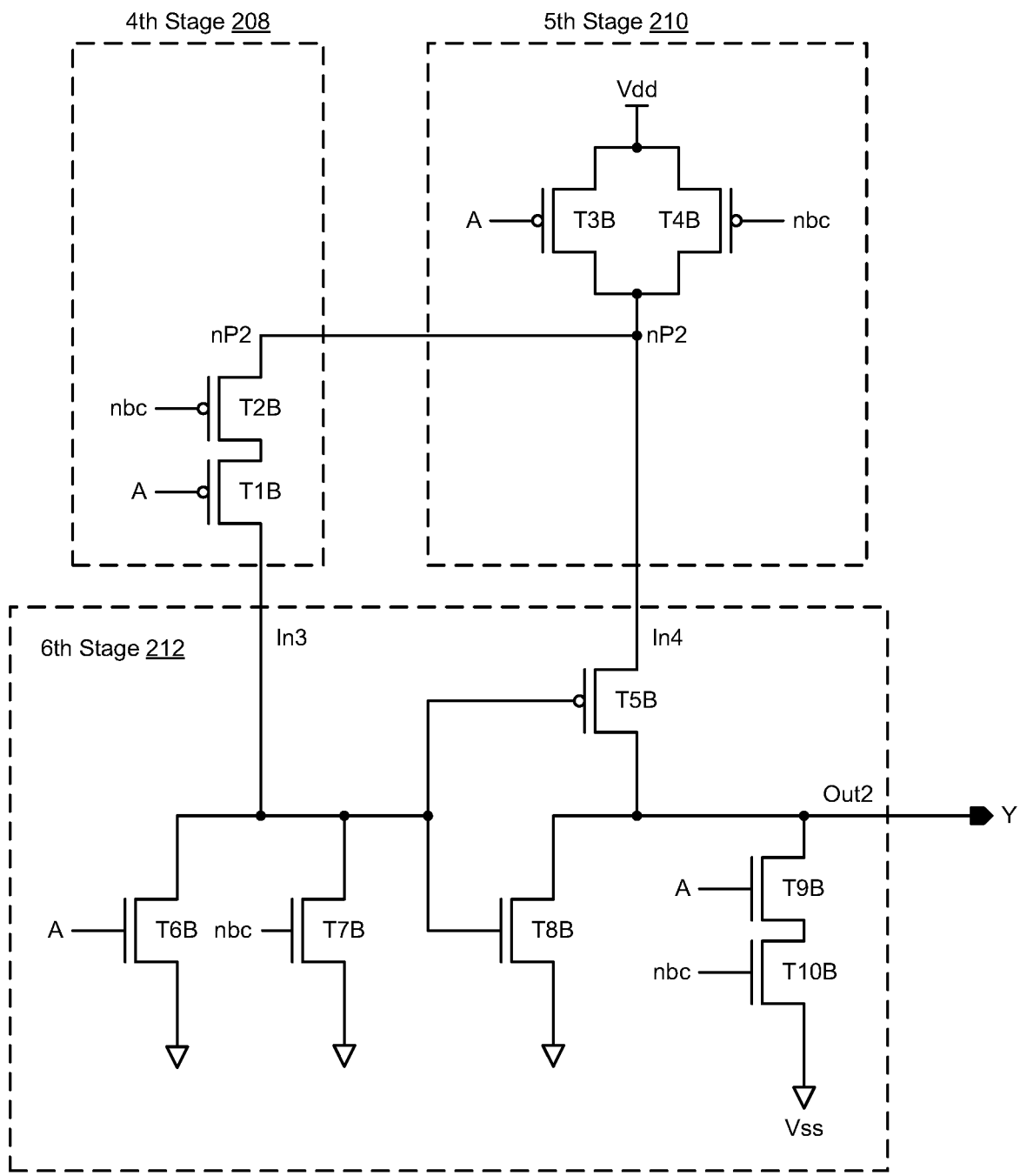
Figure 3:
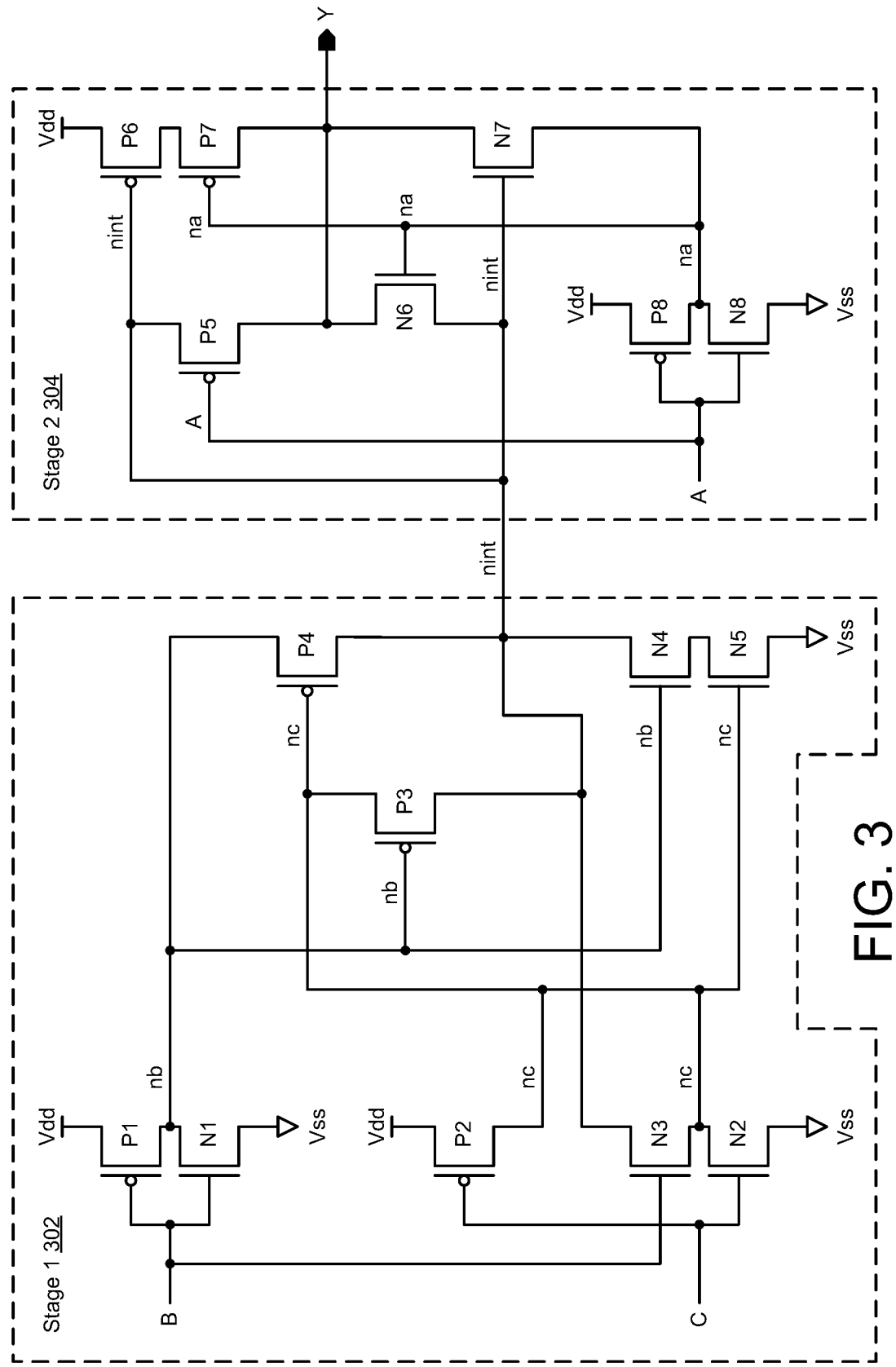

FIGS. 2A-2B and 3 illustrate various diagrams of multi-input logic circuitry in accordance with various implementations described herein. In particular, FIGS. 2A-2B illustrate a circuit diagram of multi-input logic circuitry 200 having a first portion 200A and a second portion 200B, and FIG. 3 illustrates another circuit diagram of multi-input logic circuitry 300, as an alternate implementation of FIGS. 2A-2B.

As shown in FIGS. 2A-2B, the multi-input logic circuitry 200 includes multiple stages of circuitry including a first stage 202, a second stage 204, a third stage 206, a fourth stage 208, a fifth stage 210, and a sixth stage 212 that are coupled together and arranged to receive multiple input signals (A, B, C) and provide an output (Y) based on the multiple input signals (A, B, C). In some implementations, the multi-input logic circuitry 200 may operate as a multi-input logic gate, such as, e.g., a 3-input XOR gate (i.e., XOR3) having 3-inputs (A, B, C) and 1-output (Y).

In some instances, the multi-input logic circuitry 200 may be implemented with two 2-input logic circuits 100A of FIG. 1A. For instance, the first stage 202, the second stage 204, and the third stage 206 of the multi-input logic circuitry 200, 200A of FIG. 2A may correspond to the three stages 102A, 104A, 106A of a first 2-input logic circuit 100A of FIG. 1A, and the fourth stage 208, the fifth stage 210, and the sixth stage 212 of the multi-input logic circuitry 200, 200B of FIG. 2B may also correspond to the three stages 102A, 104A, 106A of a second 2-input logic circuit 100A of FIG. 1A. Therefore, similar components may have similar features, scope, and operational characteristics.

As shown in FIG. 2A, first logic circuitry 200A may include the first stage 202 with first transistors T1A, T2A that are coupled in series and activated with the multiple input signals (B, C). The first logic circuitry 200A may include the second stage 204 with second transistors T3A, T4A that are coupled in parallel and activated with the multiple input signals (B, C). The first logic circuitry 200A may include the third stage 206 with the first input (In1) coupled to the first stage 202, the second input (In2) coupled to the second stage 204, and a first output (Out1) providing a first output signal (nbc) based on the multiple input signals (B, C). The first transistors T1A, T2A of the first stage 202 may be activated with a first input signal (B) and a second input signal (C) of the multiple signals (B, C), and the second transistors T2A, T4A of the second stage 204 may be activated with the first input signal (B) and the second input signal (C). The first transistors T1A, T2A of the first stage 202 are coupled in series between the first input (In1) and the second input (In2) of the third stage 206, and the second transistors T3A, T4A of the second stage 204 are coupled in parallel between the voltage supply (Vdd) and the second input (In2) of the third stage 206. The third stage 206 may include multiple third transistors TSA, T6A, T7A, TBA, T9A, T10A that are coupled to the first input (In1), the second input (In2), and the first output (Out1). Also, at least one third transistor (T6A, T9A) of the multiple third transistors may be activated with the first input signal (C), and at least one other third transistor (T7A, T10A) of the multiple third transistors may be activated with the second input signal (C).

As shown in FIG. 2B, second logic circuitry 200B may include the fourth stage 208 with fourth transistors T1B, T2B that are coupled in series and activated with multiple other signals (A, nbc) including the first output signal (nbc). The second logic circuitry 200B may include the fifth stage 210 with fifth transistors T3B, T4B that are coupled in parallel and activated with the multiple other signals (A, nbc) including the first output signal (nbc). The second logic circuitry 200B may include the sixth stage 212 with a third input (In3) coupled to the fourth stage 208, a fourth input (In4) coupled to the fifth stage 210, and a second output (Out2) that provides a second output signal (Y) based on the multiple other signals (A, nbc) including the first output signal (nbc). The fourth transistors T1B, T2B of the fourth stage 208 are coupled in series between the third input (In3) and the fourth input (In4) of the sixth stage 212, and the fifth transistors T3B, T4B of the fifth stage 210 are coupled in parallel between the voltage supply (Vdd) and the fourth input (In4) of the sixth stage 212. The sixth stage 212 includes multiple sixth transistors TSB, T6B, T7B, T8B, T9B, T10B that are coupled to the third input (In3), the fourth input (In4), and the second output (Out2). Also, in some instances, at least one sixth transistor (T6B, T9B) of the multiple sixth transistors is activated with the third input signal (A), and at least one other sixth transistor (T7B, T10B) of the multiple sixth transistors is activated with the first output signal (nbc).

In some instances, the multi-input logic circuitry 200 may be implemented as an integrated circuit that operates as an XOR gate such that the second output (Out2) from the second logic circuitry 200B may provide the second output signal (Y) as an XOR logic output signal. Also, combination of the multiple input signals (B, C) and the multiple other input signals (A, nbc) include three XOR input signals, and the XOR logic output signal is based on the three XOR input signals (A, B, C). This topology of FIGS. 2A-2B provides for a low area high performance solution for an XOR3 cell. In other instances, the multi-input logic circuitry 200, 200A, 200B of FIGS. 2A-2B may be reconfigured as an integrated circuit that operates as an XNOR gate, which is described herein below in greater detail in reference to FIGS. 6A-6B.

As shown in FIG. 3, the multi-input logic circuitry 300 includes multiple stages of circuitry including a first stage 302 and a second stage 304 that are coupled together and arranged to receive multiple input signals (A, B, C) and provide an output (Y) based on the multiple input signals (A, B, C). In some implementations, the multi-input logic circuitry 300 may operate as a multi-input logic gate, such as, e.g., a 3-input XOR gate (i.e., XOR3) having 3-inputs (A, B, C) and 1-output (Y). As described herein, this topology of FIG. 3 provides for a low area high performance solution for an XOR3 cell.

The first stage 302 may include first logic devices P1, P2, P3, P4, N1, N2, N3, N4, N5 that are arranged for activation with the first input signal (B) and the second input signal (C). The first stage 302 provides a first XOR output signal (nint) based on the first input signal (B) and the second input signal (B). In some implementations, the first stage 302 may operate as a 2-input XOR gate (XOR2) such that the first stage 302 provides the first XOR output signal (nint) based on the first input signal (B) and the second input signal (C) as two XOR input signals (B, C).

In some implementations, the first stage 302 includes a first inverter (P1, N1) that is activated based on the first input signal (B) and provides an inverted first input signal (nb), and the first inverter (P1, N1) is coupled between the voltage supply (Vdd) and ground (Vss). Also, the first stage 302 may include a transistor P4 coupled between the first inverter (P1, N1) and node (nint). The first stage 302 includes a second inverter (P2, N2) that is activated based on the second input signal (C) and provides an inverted second input signal (nc), and the second inverter (P2, N2) is coupled between the voltage supply (Vdd) and ground (Vss). Also, the first stage 302 may include a transmission gate (P3, N3) that is coupled between the second inverter (P2, N2) and the node (nint). The transmission gate (P3, N3) includes a transistor P3 that is activated based on the inverted first input signal (nb), and the transmission gate (P3, N3) includes another transistor N3 that is activated based on the first input signal (B). Also, the first stage 302 may include transistors (N4, N5) that are coupled in series between the node (nint) and ground (Vss). The transistor N4 may be activated based on the inverted first input signal (nb), and the transistor N5 may be activated based on the inverted second input signal (nc).

The second stage 304 may include second logic devices P5, P6, P7, P8, N6, N7, N8 that are arranged for activation with a third input signal (A) and the first XOR output signal (nint). The second stage 304 provides a second XOR output signal (Y) based on the third input signal (A) and the first XOR output signal (nint). In some implementations, the first stage 302 in combination with the second stage 304 may operate as a 3-input XOR gate (XOR3) such that the second stage 304 provides the second XOR output signal (Y) based on the first XOR output signal (nint) and the third input signal (A) as a third XOR input signal (A).

In some implementations, the second stage 304 includes a transmission gate (P5, N6) that is coupled between the node (nint) and the output (Y). The transistor P5 is activated based on the third input signal (A), and the transistor N6 is activated based on an inverted third input signal (na). The second stage 304 includes transistors P6, P7 that are coupled between the voltage supply (Vdd) and the output (Y). The transistor P6 is activated based on the node signal (nint), and the transistor P7 is activated based on the inverted third input signal (na). The second stage 304 includes a third inverter (P8, N8) that is activated based on the third input signal (A) and provides the inverted third input signal (na), and the third inverter (P8, N8) is coupled between the voltage supply (Vdd) and ground (Vss). Also, the second stage 304 may include a transistor N7 that is coupled between the third inverter (P8, N8) and the output (Y), and the transistor N7 is activated based on the the first XOR output signal (nint) at node (nint).

Figure 4A:
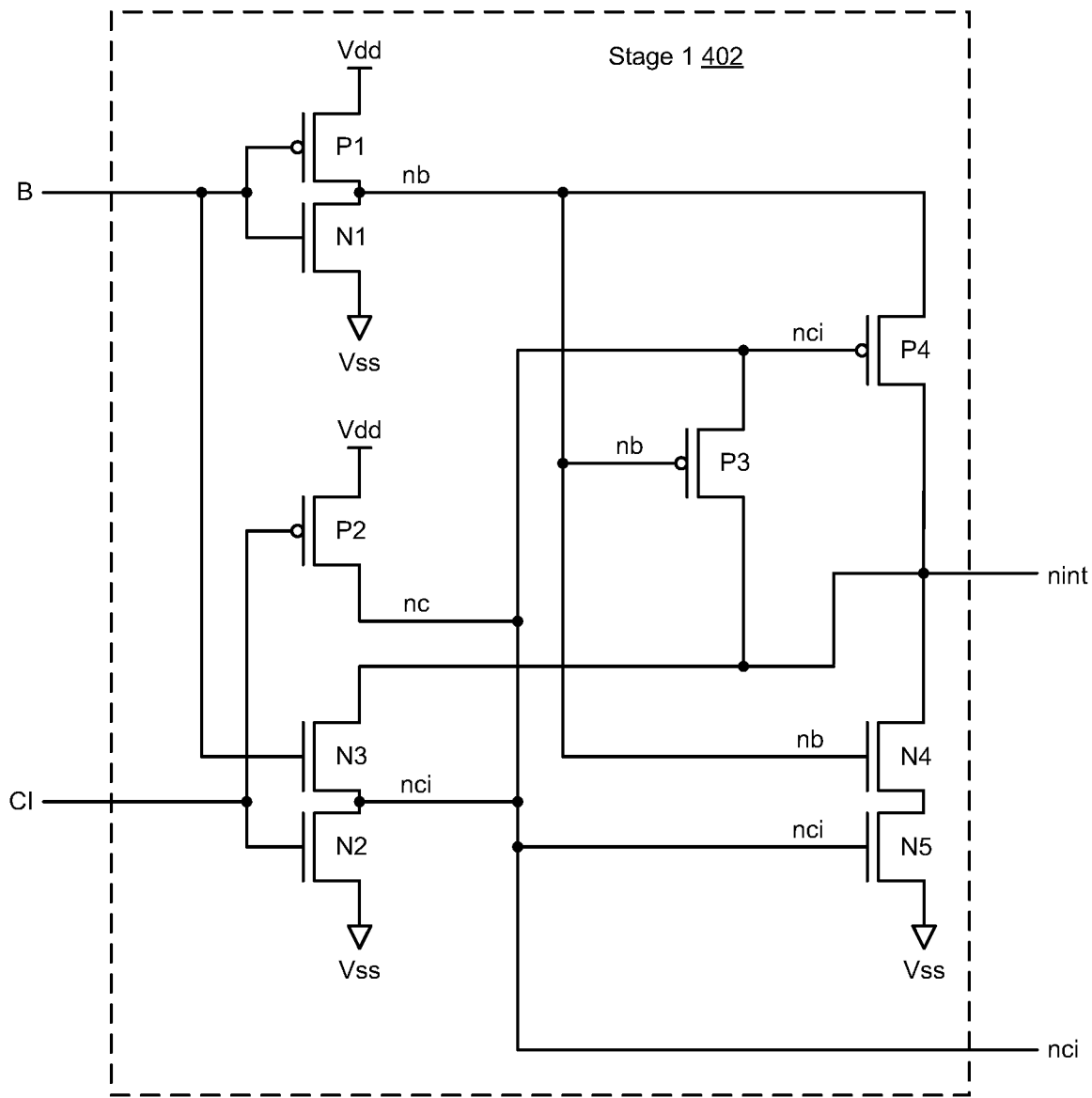
FIGS. 4A-4C illustrate diagrams of full adder logic circuitry in accordance with various implementations described herein.
Figure 4B:
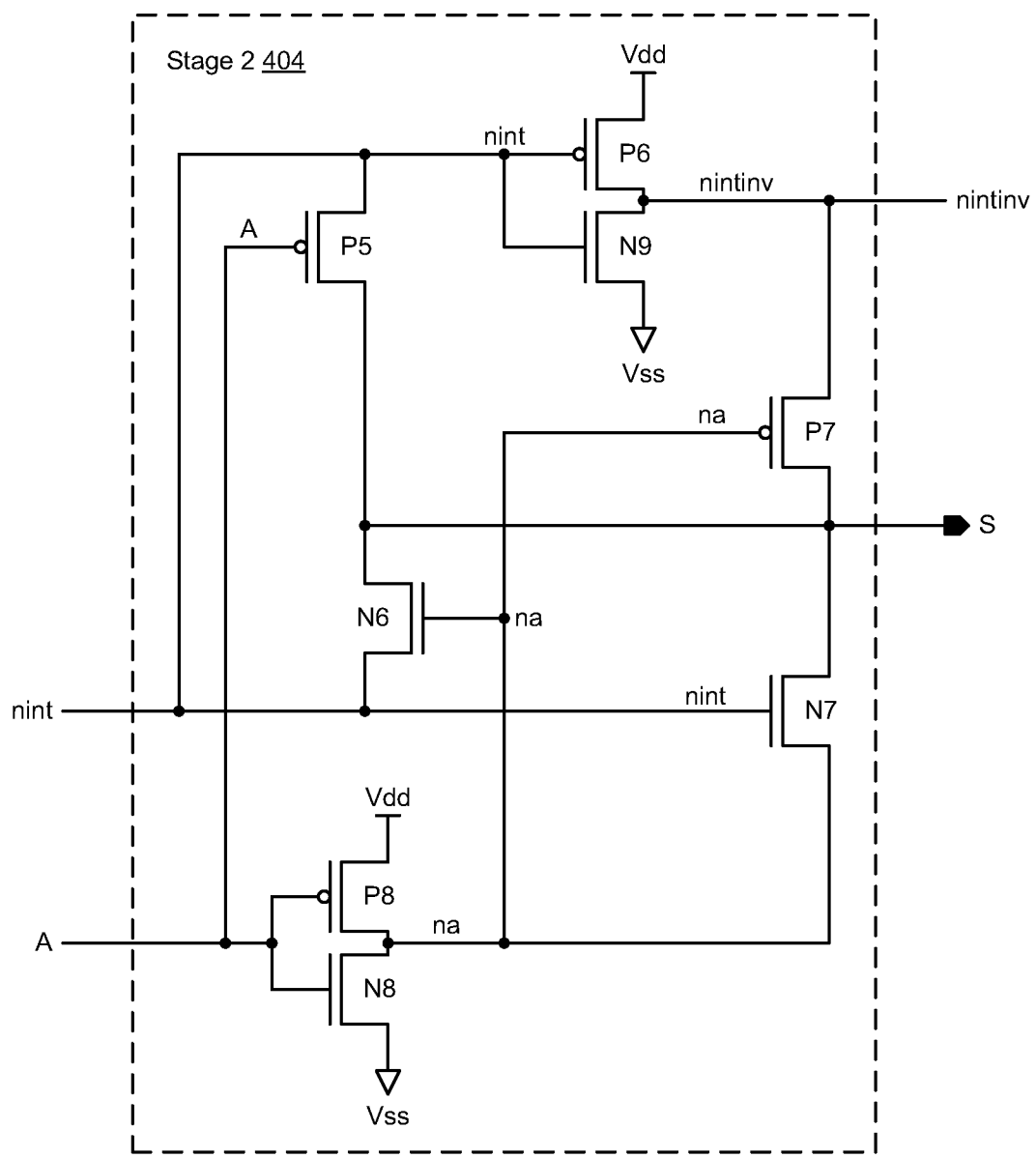
Figure 4C:
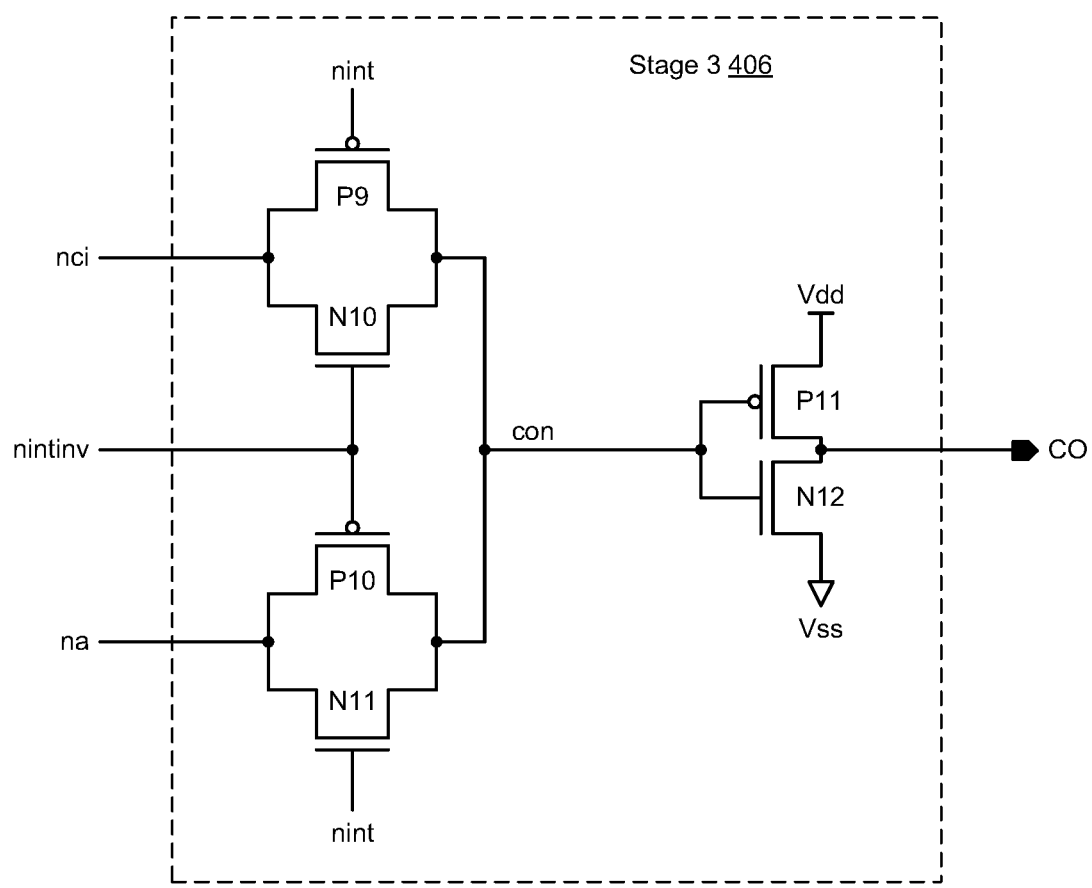

FIGS. 4A-4C illustrate diagrams of full adder logic circuitry 400 in accordance with various implementations described herein. In particular, FIG. 4A illustrates a first part 400A of the full adder logic circuitry 400, FIG. 4B illustrates a second part 400B of the full adder logic circuitry 400, and FIG. 4C illustrates a third part 400C of the full adder logic circuitry 400. In some implementations, the full adder logic circuitry 400 may be configured to receive 3 inputs (A, B, CI (or Cin)) and provide 2 outputs (S, CO (or Cout)). This topology shown in FIGS. 4A-4C provides for a low area high performance solution for a full Adder cell. In some implementations, the full adder logic circuitry 400 refers to an alternate re-configuration of the multi-input logic circuitry 300 of FIG. 3, and, similar components have similar features, scope, and operational characteristics.

As shown in FIG. 4A, the first part 400A of the full adder logic circuitry 400 includes a first stage 402 that is similar to the first stage 302 of the multi-input logic circuitry 300. Also, as shown in FIG. 4B, the second part 400B of the full adder logic circuitry 400 includes a second stage 404 that is similar to the second stage 304 of the multi-input logic circuitry 300. Further, in FIG. 4C, the third part 400C of the full adder logic circuitry 400 includes a third stage 406 that is coupled to the first stage 402 via node (nci).

In reference to the first stage 402, the second inverter (P2, N2) is activated based on the C-input signal (CI or Cin) and provides an inverted C-input signal (nci). Also, the transistor (P4) is activated based on the inverted C-input signal (nci), and the transistor (N5) is activated based on the inverted C-input signal (nci).

In reference to the second stage 404, inverter (P6, N9) is activated based on the node signal (nint) and provides an inverted node signal (nintinv). The transistor (P7) is coupled between the inverter (P6, N9) and the output node (S), and the transistor (P7) is activated based on the inverted third input signal (na). The transistor (N6) is coupled between the output node (S) and the node (nint), and the transistor (N6) is activated based on the inverted third input signal (na). The transistor (N7) is coupled between the inverter (P8, N8) and the output node (S), and the transistor (N7) is activated based on the first XOR output signal (nint) at node (nint). As shown in FIG. 4B, the output signal (S) may be coupled between the transistors (P7, N7), and the transmission gate (P5, N6) may be coupled between the node (nint) and the output node (S).

As shown in FIG. 4C, the third stage 406 includes a transmission gate (P9, N10) that is coupled between the node (nci) and an inverter (P10, N11). The transmission gate (P9, N10) includes a transistor P9 that is activated with the node signal (nint), and the transmission gate (P9, N10) includes another transistor N10 that is activated with inverted node signal (nintinv). The third stage 406 includes another transmission gate (P10, N11) that is coupled between the inverted third input signal node (na) and inverter (P11, N12). The transmission gate (P10, N11) includes a transistor P10 that is activated with the inverted node signal (nintinv), and the transmission gate (P10, N11) includes another transistor N11 that is activated with the node signal (nint). Also, the inverter (P11, N12) is activated with (con) signal, which is associated with the (nci) signal and the (na) signal. As shown in FIG. 4C, the inverter (P11, N12) may receive and invert the (con) signal so as to provide the C-output signal (CO) or (Cout) signal. Also, the inverter (P11, N12) is coupled between the voltage supply (Vdd) and ground (Vss).

In some implementations, in FIGS. 4A-4C, the first stage 402 may operate as a 2-input first stage of a full adder (ADDF) such that the first stage provides the first XOR output signal as an intermediate signal (nint) of the full adder (ADDF) based on the first input signal (B) and the second input signal (C) as two input signals (B, C) of the full adder (ADDF). Also, the first stage 402 in combination with the second stage 404 may operate as a 3-input full adder (ADDF3) such that the second stage 404 provides the second XOR output signal as an output signal (S) of the full adder (ADDF) based on one or more of the intermediate signal (nint) and the third input signal (A). Also, the third stage 406 includes third logic devices P9, N10, P10, N11, P11, N12 that are arranged for activation with the inverted second input signal (nci), the inverted node signal (nintinv), and the inverted third input signal (na), wherein the third stage 306 may provide another output signal (CO) or (Cout) of the full adder (ADDF) based on the received signals (nci, nintinv, na).

Figure 5A:
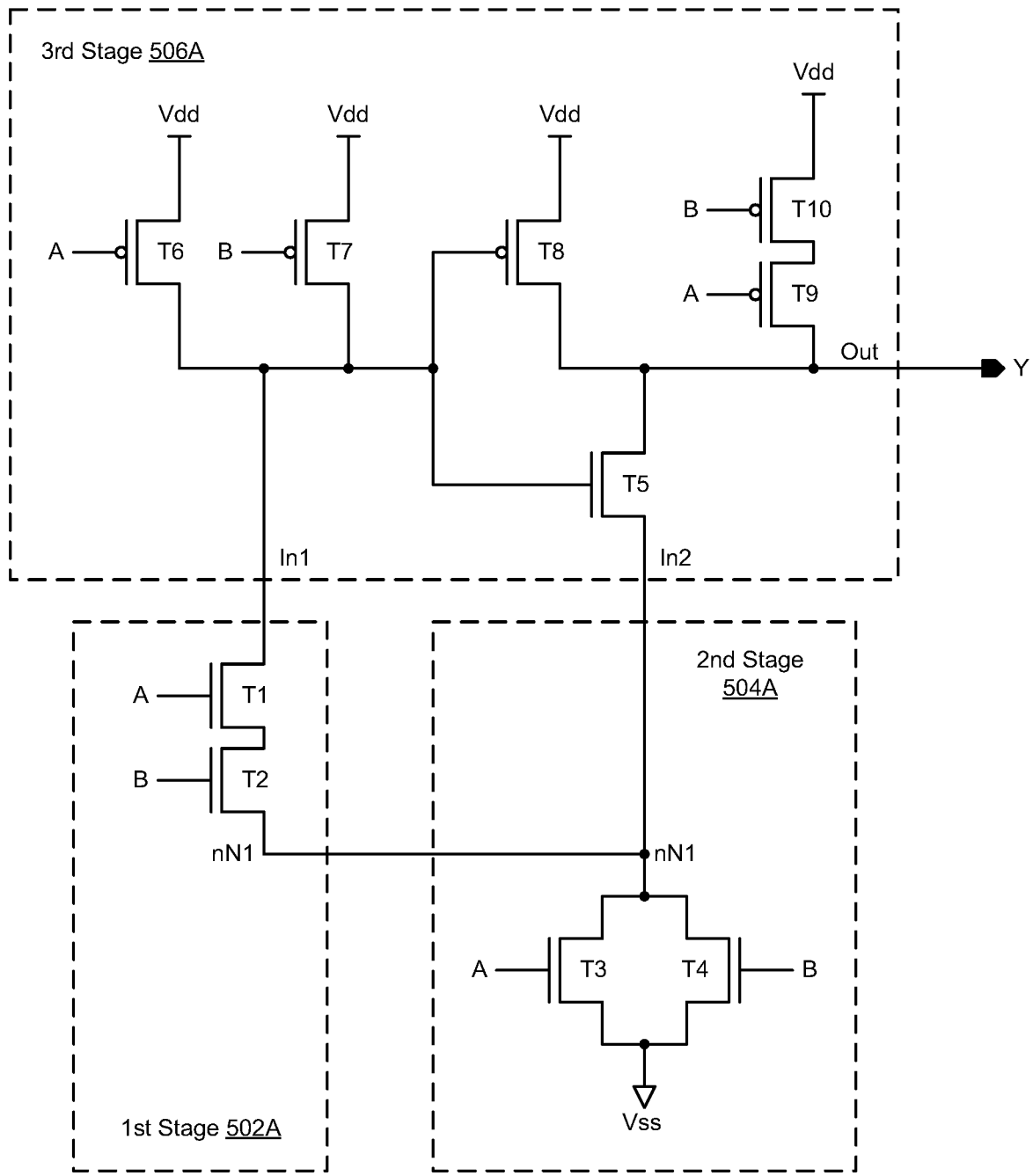
FIGS. 5A-5B illustrate diagrams of multi-input logic circuitry in accordance with various implementations described herein.
Figure 5B:
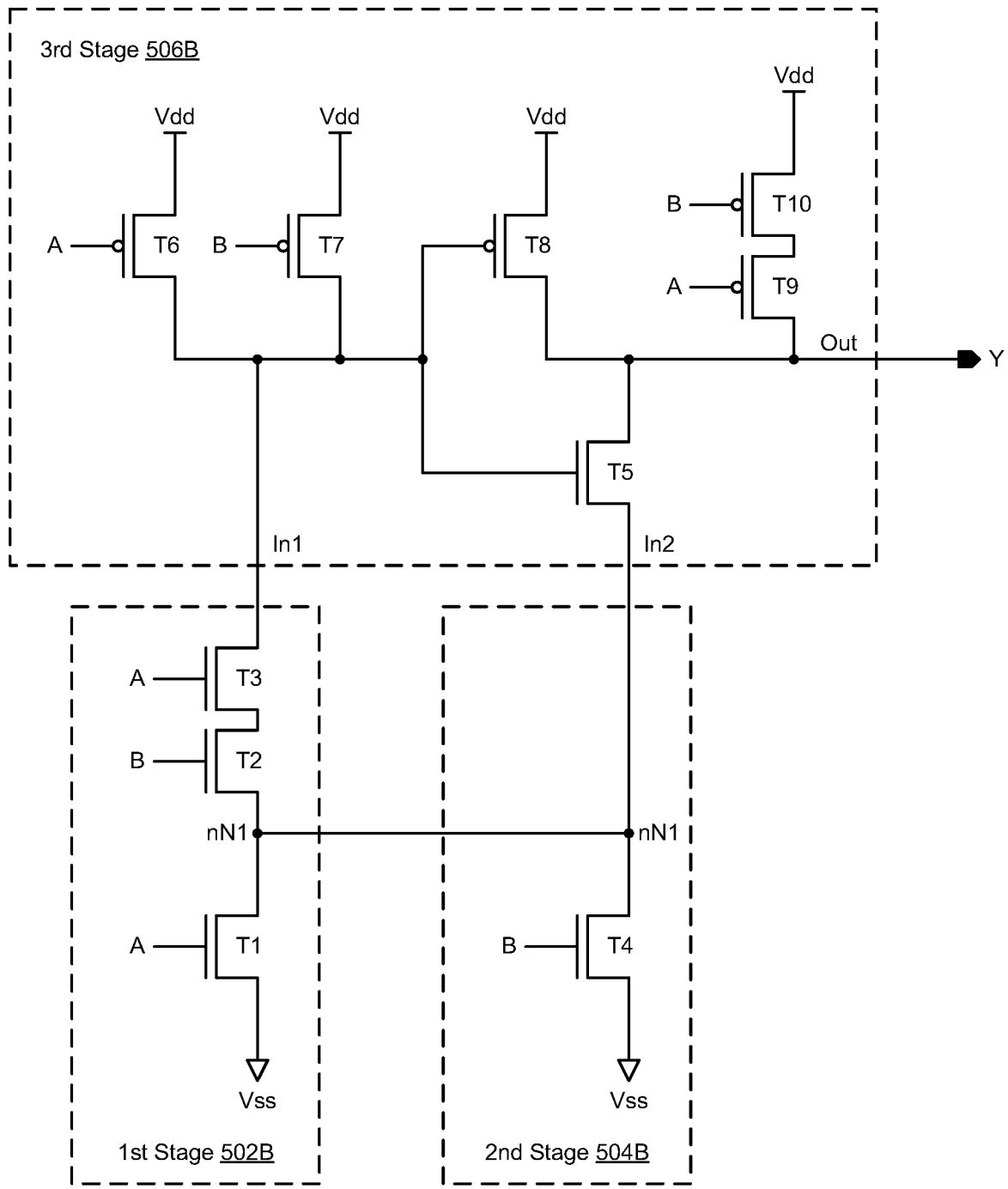

FIGS. 5A-5B illustrate various diagrams of multi-input logic circuitry 500A, 500B in accordance with various implementations described herein. In particular, FIG. 5A illustrates a circuit diagram of multi-input logic circuitry 500A, and FIG. 5B illustrates a circuit diagram of multi-input logic circuitry 500B.

In FIG. 5A, the multi-input logic circuitry 500A may refer to a re-configuration of the multi-input logic circuitry 100A of FIG. 1A, and as such, similar components may have similar features, scope, and operational characteristics. As described herein below, this topology of FIG. 5A provides for a low area high performance solution for an XNOR2 cell. For instance, the multi-input logic circuitry 100A of FIG. 1A, which is implemented as a 2-input XOR logic gate, may be re-configured as a 2-input XNOR logic gate and implemented as the multi-input logic circuitry 500A of FIG. 5A.

As shown in FIG. 5A, the multi-input logic circuitry 500A may include multiple stages of circuitry including a first stage 502A, a second stage 504A and a third stage 506A that are coupled together and arranged to receive multiple input signals (A, B) and provide an output (Y) based on the multiple input signals (A, B). In some implementations, the multi-input logic circuitry 500A may operate as a multi-input logic gate, such as, e.g., a 2-input XNOR gate (i.e., XNOR2) having 2-inputs (A, B) and 1-output (Y).

As such, in some implementations, the multi-input logic circuitry 500A may be implemented as an integrated circuit that operates as an XNOR gate such that the output (Y) from the third stage 506A provides the output signal (Y) as an XNOR logic output signal. In this instance, the first input signal (A) is a first XNOR input signal, the second input signal (B) is a second XNOR input signal, and the XNOR logic output signal (Y) is based on the first XOR input signal (A) and the second XOR input signal (B).

In FIG. 5B, the multi-input logic circuitry 500B may refer to a re-configuration of the multi-input logic circuitry 100B of FIG. 1B, and as such, similar components may have similar features, scope, and operational characteristics. As described herein below, this topology of FIG. 5B provides for a low area high performance solution for an XNOR2 cell. For instance, the multi-input logic circuitry 100B of FIG. 1B, which is implemented as a 2-input XOR logic gate, may be re-configured as a 2-input XNOR logic gate and implemented as the multi-input logic circuitry 500B of FIG. 5B.

As shown in FIG. 5B, the multi-input logic circuitry 500B may include multiple stages of circuitry including a first stage 502B, a second stage 504B and a third stage 506B that are coupled together and arranged to receive multiple input signals (A, B) and provide an output (Y) based on the multiple input signals (A, B). In some implementations, the multi-input logic circuitry 500B may operate as a multi-input logic gate, such as, e.g., a 2-input XNOR gate (i.e., XNOR2) having 2-inputs (A, B) and 1-output (Y).

As such, in some implementations, the multi-input logic circuitry 500B may be implemented as an integrated circuit that operates as an XNOR gate such that the output (Y) from the third stage 506B provides the output signal (Y) as an XNOR logic output signal. In this instance, the first input signal (A) is a first XNOR input signal, the second input signal (B) is a second XNOR input signal, and the XNOR logic output signal (Y) is based on the first XOR input signal (A) and the second XOR input signal (B).

Figure 6A:
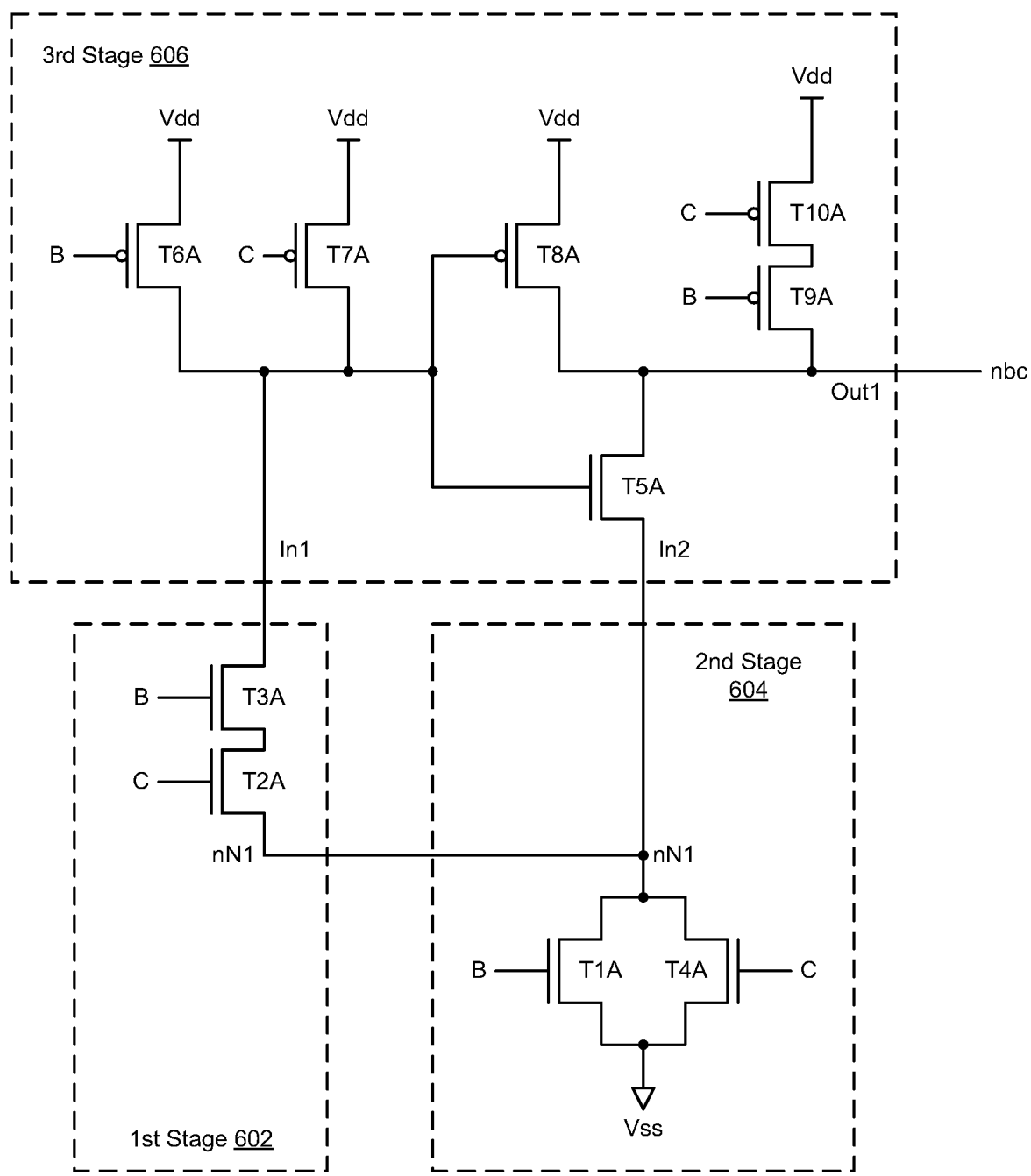
FIGS. 6A-6B and 7 illustrate diagrams of other multi-input logic circuitry in accordance with various implementations described herein.
Figure 6B:
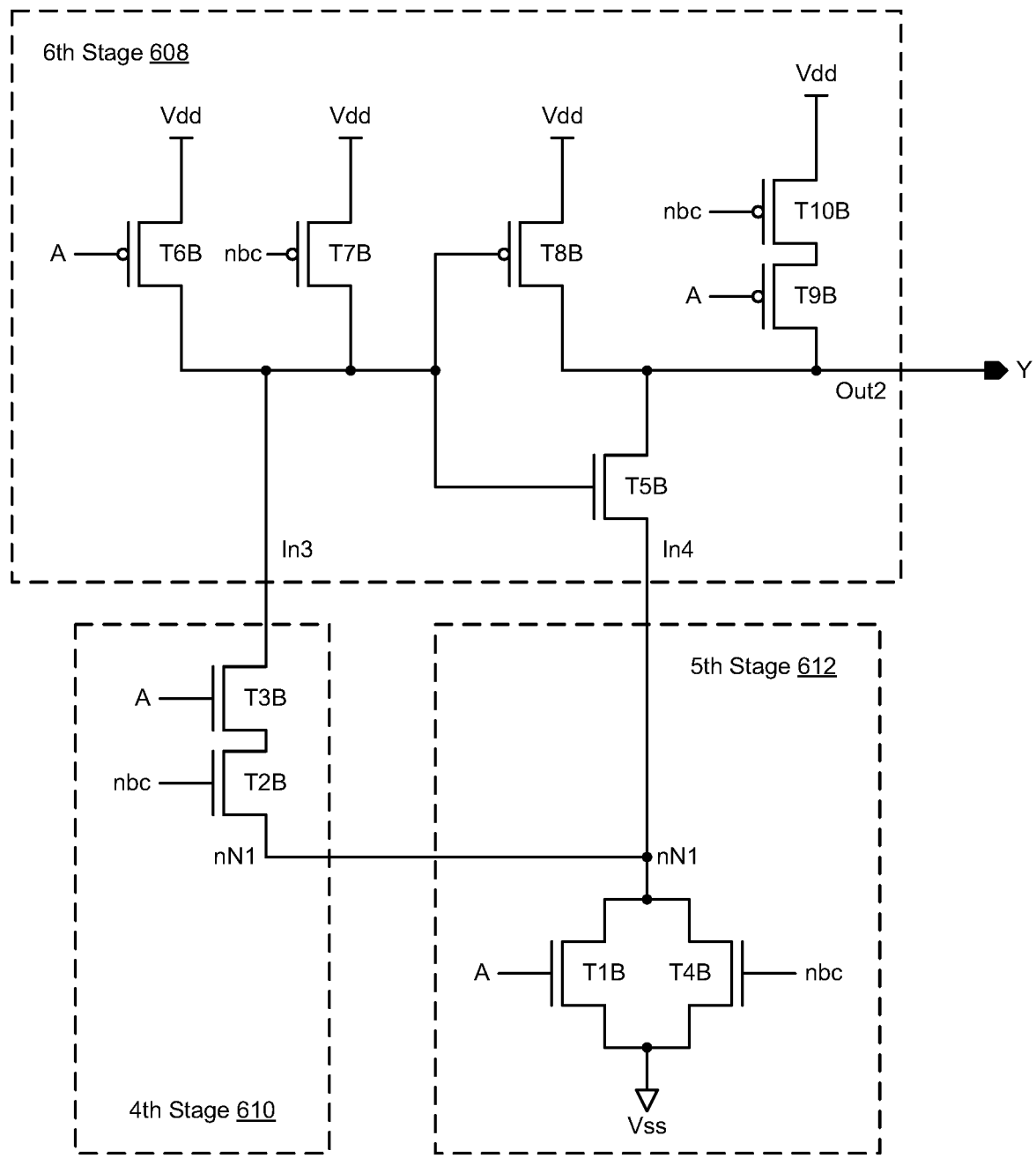
Figure 7:
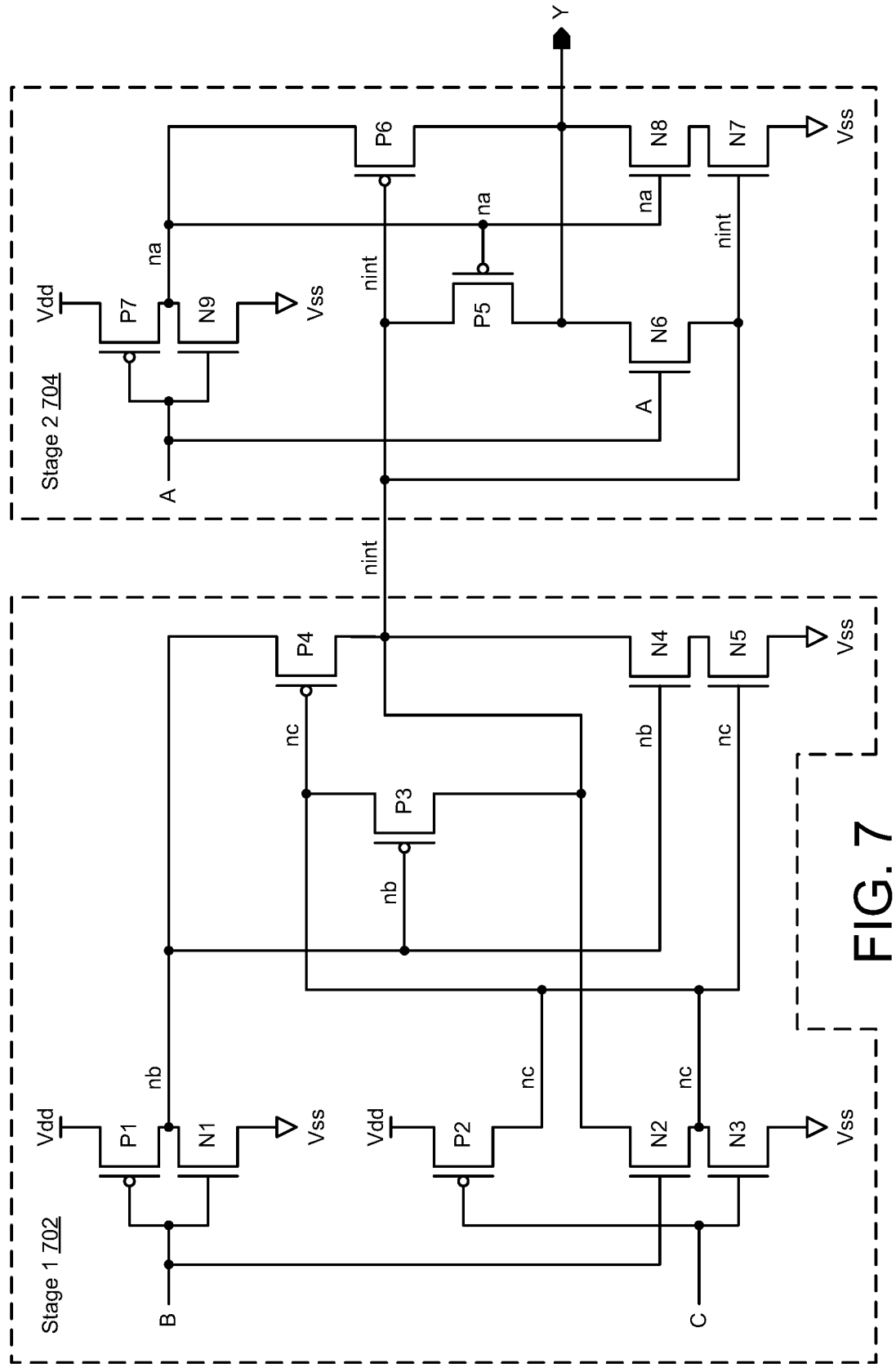

FIGS. 6A-6B and 7 illustrate various diagrams of multi-input logic circuitry 600, 700 in accordance with various implementations described herein. In particular, FIGS. 6A-6B illustrate a circuit diagram of multi-input logic circuitry 600, and FIG. 7 illustrates a circuit diagram of multi-input logic circuitry 700.

In FIGS. 6A-6B, the multi-input logic circuitry 600, 600A, 600B may refer to a re-configuration of the multi-input logic circuitry 200, 200A, 200B of FIGS. 2A-2B, and as such, similar components have similar features, scope, and operational characteristics. As described herein below, this topology of FIGS. 6A-6B provides for a low area high performance solution for an XNOR3 cell. For instance, the multi-input logic circuitry 600, 600A, 600B of FIGS. 6A-6B, which is implemented as a 3-input XOR logic gate, may be re-configured as a 3-input XNOR logic gate and implemented as the multi-input logic circuitry 600 of FIGS. 6A-6B.

Thus, the multi-input logic circuitry 600, 600A, 600B may be implemented as an integrated circuit that operates as an XNOR gate such that the second output (Y) from second logic circuitry 600B provides the second output signal (Y) as an XNOR logic output signal. In this instance, combination of multiple input signals (B, C) and the multiple other input signals (nbc, A) include three XNOR input signals (A, B, C), and the XNOR logic output signal (Y) is based on the three XNOR input signals (A, B, C).

In FIG. 7, the multi-input logic circuitry 700 may refer to a re-configuration of the multi-input logic circuitry 300 of FIG. 3, and as such, similar components may have similar features, scope, and operational characteristics. As described herein below, this topology of FIG. 7 may provide for a low area high performance solution for an XNOR3 cell. For instance, the multi-input logic circuitry 300 of FIG. 3, which is implemented as a 3-input XOR logic gate, may be re-configured as a 3-input XNOR logic gate and thus implemented as the multi-input logic circuitry 700 of FIG. 7.

As shown in FIG. 7, the multi-input logic circuitry 700 may include multiple stages of circuitry including a first stage 702 and a second stage 704 that are coupled together and arranged to receive multiple input signals (A, B, C) and provide an output (Y) based on the multiple input signals (A, B, C). In some implementations, the multi-input logic circuitry 700 may operate as a multi-input logic gate, such as, e.g., a 3-input XNOR gate (i.e., XNOR3) having 3-inputs (A, B, C) and 1-output (Y).

As such, in some implementations, the multi-input logic circuitry 700 may be implemented as an integrated circuit that includes the first stage 702 and the second stage 704. The first stage 702 may operate as a 2-input XNOR gate such that the first stage 702 provides the first XNOR output signal (nint) based on the first input signal (B) and the second input signal (C) as two XNOR input signals (B, C). Also, the first stage 702 in combination with the second stage 704 may operate as a 3-input XNOR gate such that the second stage 704 provides the second XNOR output signal (Y) based on the first XNOR output signal (nint) and the third input signal (A) as a third XNOR input signal.

Described herein are various implementations of an integrated circuit. The integrated circuit may include a first stage having first logic structures coupled in series, and the first logic structures may be activated with multiple signals. The integrated circuit may include a second stage having second logic structures coupled in parallel, and the second logic structures may be activated with the multiple signals. The integrated circuit may include a third stage having a first input, a second input, and an output. The first input may be coupled to the first stage, the second input may be coupled to the second stage, and the output may provide an output signal based on the multiple signals.

Described herein are various implementations of an integrated circuit. The integrated circuit may include first logic circuitry having a first stage with first transistors coupled in series and activated with multiple signals, a second stage with second transistors coupled in parallel and activated with the multiple signals, and a third stage with a first input coupled to the first stage, a second input coupled to the second stage, and a first output providing a first output signal based on the multiple signals. The integrated circuit may include second logic circuitry having a fourth stage with fourth transistors coupled in series and activated with multiple other signals including the first output signal, a fifth stage with fifth transistors coupled in parallel and activated with the multiple other signals including the first output signal, and a sixth stage with a third input coupled to the fourth stage, a fourth input coupled to the fifth stage, and a second output providing a second output signal based on the multiple other signals including the first output signal.

Described herein are various implementations of an integrated circuit. The integrated circuit may include a first stage having first logic devices arranged for activation with a first input signal and a second input signal, wherein the first stage provides a first XOR output signal based on the first input signal and the second input signal. The integrated circuit may include a second stage having second logic devices arranged for activation with a third input signal and the first XOR output signal, wherein the second stage provides a second XOR output signal based on the third input signal and the first XOR output signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
fabricating first multi-stage logic with a first stage, a second stage and a third stage, wherein the first stage and the second stage are activated with first signals, wherein the third stage has a first input coupled to the first stage, a second input coupled to the second stage, and a first output that provides a first output signal based on the first signals; and
fabricating second multi-stage logic with a fourth stage, a fifth stage and a sixth stage, wherein the fourth stage and the fifth stage are activated with second signals and the first output signal, wherein the sixth stage has a third input coupled to the fourth stage, a fourth input coupled to the fifth stage, and a second output that provides a second output signal based on the second signals and the first output signal,
wherein the second output signal refers to an XOR logic output signal or an XNOR logic output signal.

2. The method of claim 1, wherein:
the first stage has first transistors coupled in series,
the second stage has second transistors coupled in parallel, and
the third stage has third transistors coupled to the first input, the second input, and the first output that provides the first output signal based on the first signals.

3. The method of claim 1, wherein:
the second transistors receive a voltage supply and provide the voltage supply to the first transistors and the second input of the third stage when activated, and
the first transistors receive the voltage supply from the second transistors and provide the voltage supply to the first input of the third stage when activated.

4. The method of claim 1, wherein:
the fourth stage has fourth transistors coupled in series,
the fifth stage has fifth transistors coupled in parallel, and
the sixth stage has sixth transistors coupled to the third input, the fourth input, and the second output that provides the second output signal based on the second signals and the first output signal.

5. The method of claim 4, wherein:
the fifth transistors receive a voltage supply and provide the voltage supply to the fourth transistors and the fourth input of the sixth stage when activated, and
the fourth transistors receive the voltage supply from the fifth transistors and provide the voltage supply to the third input of the third stage when activated.

6. A method comprising:
fabricating first multi-stage logic with a first stage, a second stage and a third stage, wherein the first stage and the second stage are activated with first signals, wherein the third stage has a first input coupled to the first stage, a second input coupled to the second stage, and a first output that provides a first output signal based on the first signals;
fabricating second multi-stage logic with a fourth stage, a fifth stage and a sixth stage, wherein the fourth stage and the fifth stage are activated with second signals and the first output signal, wherein the sixth stage has a third input coupled to the fourth stage, a fourth input coupled to the fifth stage, and a second output that provides a second output signal based on the second signals and the first output signal;
operating the first multi-stage logic in combination with the second multi-stage logic as an XOR gate such that the second output from the second multi-stage logic
provides the second output signal as an XOR logic
output signal;

the first signals and the second signals refer to multiple
XOR input signals; and the XOR logic output signal is based on the multiple XOR
input signals.

7. A method comprising:

fabricating first multi-stage logic with a first stage, a
second stage and a third stage, wherein the first stage
and the second stage are activated with first signals,
wherein the third stage has a first input coupled to the
first stage, a second input coupled to the second stage,
and a first output that provides a first output signal
based on the first signals;

fabricating second multi-stage logic with a fourth stage, a
fifth stage and a sixth stage, wherein the fourth stage
and the fifth stage are activated with second signals and
the first output signal, wherein the sixth stage has a
third input coupled to the fourth stage, a fourth input
coupled to the fifth stage, and a second output that
provides a second output signal based on the second
signals and the first output signal;

operating the first multi-stage logic in combination with
the second multi-stage logic as an XNOR gate such that
the second output from the second multi-stage logic
provides the second output signal as an XNOR logic
output signal;

the first signals and the second signals refer to multiple
XNOR input signals;

the XNOR logic output signal is based on the multiple
XNOR input signals.

8. A circuit comprising:

first logic having first transistors coupled in series and
activated with first signals, second transistors activated
with the first signals, and third transistors configured
with a first input coupled to the first transistors, a
second input coupled to the second transistors, and a
first output that provides a first output signal based on
the first signals; and second logic having fourth transistors coupled in series
and activated with second signals including the first
output signal, fifth transistors coupled in parallel and
activated with the second signals including the first
output signal, and sixth transistors configured with a
third input coupled to the fourth transistors, a fourth
input coupled to the fifth transistors, and a second
output that provides a second output signal based on the
second signals including the first output signal, wherein the second output signal refers to an XOR logic
output signal or an XNOR logic output signal.

9. The circuit of claim 8, wherein the first logic includes:

a first stage having the first transistors coupled in series,
a second stage having the second transistors coupled in
parallel, and
a third stage having the third transistors coupled to the
first input, the second input, and the first output that
provides the first output signal based on the first
signals.

10. The circuit of claim 8, wherein the second logic
includes:

a fourth stage having the fourth transistors coupled in
series,
a fifth stage having the fifth transistors coupled in parallel,
and
a sixth stage having the sixth transistors coupled to the
third input, the fourth input, and the second output that
provides the second output signal based on the second
signals.

11. The circuit of claim 8, wherein:

the first transistors and the second transistors are activated
with a first input signal and a second input signal of the
first signals,
the first transistors are coupled in series between the first
input and the second input of the third stage,
the second transistors of the second stage are coupled in
parallel between a voltage supply and the second input
of the third stage, and
at least one third transistor is activated with the first input
signal, and at least one other third transistor is activated
with the second input signal.

12. The circuit of claim 8, wherein:

the fourth transistors and the fifth transistors are activated
with a third input signal of the second signals and the
first output signal,
the fourth transistors are coupled in series between the
third input and the fourth input, and
the fifth transistors are coupled in parallel between a
voltage supply and the fourth input.

13. A circuit comprising:

first logic having first transistors coupled in series and
activated with first signals, second transistors activated
with the first signals, and third transistors configured
with a first input coupled to the first transistors, a
second input coupled to the second transistors, and a
first output that provides a first output signal based on
the first signals; and second logic having fourth transistors coupled in series
and activated with second signals including the first
output signal, fifth transistors coupled in parallel and
activated with the second signals including the first
output signal, and sixth transistors configured with a
third input coupled to the fourth transistors, a fourth
input coupled to the fifth transistors, and a second
output that provides a second output signal based on the
second signals including the first output signal, wherein the circuit operates as an XOR gate such that the
second output from the second logic provides the
second output signal as an XOR logic output signal,
and wherein a combination of the first signals and the second
signals refer to multiple XOR input signals, and wherein the XOR logic output signal is based on the
multiple XOR input signals.

14. A circuit comprising:

first logic having first transistors coupled in series and
activated with first signals, second transistors activated
with the first signals, and third transistors configured
with a first input coupled to the first transistors, a
second input coupled to the second transistors, and a
first output that provides a first output signal based on
the first signals; and second logic having fourth transistors coupled in series
and activated with second signals including the first
output signal, fifth transistors coupled in parallel and
activated with the second signals including the first
output signal, and sixth transistors configured with a
third input coupled to the fourth transistors, a fourth
input coupled to the fifth transistors, and a second
output that provides a second output signal based on the
second signals including the first output signal, wherein the circuit operates as an XNOR gate such that the second output from the second logic provides the second output signal as an XNOR logic output signal, wherein a combination of the first signals and the second signals refer to multiple XNOR input signals, and wherein the XNOR logic output signal is based on the multiple XNOR input signals.

15. A circuit comprising:

a first stage having first logic devices arranged for activation with a first input signal and a second input signal, wherein the first stage provides a first output signal based on the first input signal and the second input signal; and a second stage having second logic devices arranged for activation with a third input signal and the first output signal, wherein the second stage provides a second output signal based on the third input signal and the first output signal, wherein the second output signal refers to an XOR output signal, wherein the first stage and the second stage are coupled together to operate as a multi-input XOR gate that provides the XOR output signal as a single XOR output signal based on the first input signal, the second input signal and the third input signal.

16. The circuit of claim 15, wherein the first stage operates as a multi-input first stage of a full adder such that the first stage provides the first XOR output signal as an internal signal of the full adder based on the first input signal and the second input signal as two input signals of the full adder.

* * * * *